(12) United States Patent
Raimondi et al.

(10) Patent No.: US 7,499,252 B2
(45) Date of Patent: Mar. 3, 2009

(54) DRIVER CIRCUIT

(75) Inventors: Giovanni Mario Raimondi, Leighton Buzzard (GB); Steven Martin Galecki, Concord, OH (US)

(73) Assignee: Goodrich Control Systems Limited (GB)

(*) Notice: Subject to any disclaimer, the term of this patent is extended or adjusted under 35 U.S.C. 154(b) by 41 days.

(21) Appl. No.: 11/470,345

(22) Filed: Sep. 6, 2006

(65) Prior Publication Data

US 2008/0062602 A1    Mar. 13, 2008

(51) Int. Cl.
*H02H 3/08* (2006.01)
*H02H 9/02* (2006.01)

(52) U.S. Cl. ............ 361/93.1; 361/57; 361/58; 361/94

(58) Field of Classification Search ............ 361/93.1, 361/57, 58, 94, 93
See application file for complete search history.

(56) References Cited

U.S. PATENT DOCUMENTS

| | | | | |
|---|---|---|---|---|
| 4,678,984 A | * | 7/1987 | Henze | 323/285 |
| 4,851,743 A | * | 7/1989 | Schmerda et al. | 388/811 |
| 5,559,660 A | * | 9/1996 | Watson et al. | 361/58 |
| 5,635,770 A | * | 6/1997 | Evans et al. | 307/10.6 |
| 5,920,186 A | * | 7/1999 | Ninh et al. | 323/303 |
| 6,703,889 B2 | * | 3/2004 | Dodson, III | 327/434 |
| 6,747,300 B2 | * | 6/2004 | Nadd et al. | 257/288 |

* cited by examiner

*Primary Examiner*—Stephen W Jackson
*Assistant Examiner*—Zeev Kitov
(74) *Attorney, Agent, or Firm*—Andrus, Sceales, Starke & Sawall, LLP

(57) ABSTRACT

A driver circuit for an electronic switch, the driver circuit having a first input for receiving a first control signal, and a second input for receiving a signal from a current sensor, the driver circuit further including a shut-off circuit for operating the electronic switch to cause an interruption to current flow in the event of a fault condition arising, such as current through the electronic switch exceeding a predetermined threshold, wherein operation of the shut-off circuit can be invoked by a predetermined event at the first input.

11 Claims, 4 Drawing Sheets

DRIVER CIRCUIT

FIELD OF THE INVENTION

The present invention relates to a driver circuit, for example, for an electronic switch, and more particularly to a driver circuit which is adapted to perform a self test of protective features therein.

BACKGROUND OF THE INVENTION

Semiconductor switches, such as MOSFETs, are commonly used as "high-side" switches. In an example of such an arrangement the source of the N-channel MOSFET is connected to the high voltage side of a load and a drain of the N-channel MOSFET is connected to a voltage source and vice versa for P channel MOSFET's. In practice the load is typically connected between the N-channel MOSFET and a local ground either directly or via a low side switch. Therefore when the MOSFET high side switch is in a high impedance state the voltage occurring at either side of the load is effectively the ground voltage. This is recognised as a generally desirable feature. The load is typically supplied from a power supply which may be at a relatively high voltage, for example several hundred volts. In contrast, a control system which is responsible for instructing the high side switch to be turned on or off will generally operate at a significantly lower voltage of generally only a few volts or at most a few tens of volts. It is therefore necessary to provide an interface between the low voltage control system and the MOSFET switch. This interface can be regarded as an electronic switch driver circuit which generally requires an independent floating power supply.

The driver circuit can be used to provide enhanced protection against fault conditions. It is, for example, known to include a current measuring capability within the driver circuit and to use the driver circuit to automatically initiate opening of the semiconductor switch (that is placing the semiconductor switch in a high impedance state) in the event that excess current flow is detected. This safety feature is, in a well designed system, only invoked in response to a fault condition. Consequently this safety feature may not be used for a considerable period of time. It is therefore possible that a fault might develop in relation to this safety feature within the driver circuit, and that such a fault may remain dormant, that is not noticed, for a considerable period of time.

SUMMARY OF THE INVENTION

According to a first aspect of the present invention there is provided a driver circuit for an electronic switch, the driver circuit having a first input for receiving a first signal, the driver circuit further including a shut off circuit for operating the electronic switch to cause an interruption to the current flow through the electronic switch in the event of a fault condition, wherein operation of the shut off circuit can be invoked by a predetermined event at the first input.

It is thus possible to provide a driver circuit where operation of the shut off circuit can be tested without requiring any additional connections to the driver circuit. This is particularly advantageous in aerospace applications where reliability is paramount as each additional connection introduces a new failure mode and also incurs a weight penalty. Furthermore the avoidance of any additional connections means that the present invention can be retrofitted to existing installations without requiring additional wiring.

Advantageously operation of the shut off circuit is invoked in response to receipt of an instruction at the first input to switch the electronic switch into a low impendence state. This has the advantage that operation of the shut off circuit is tested each time it is desired to place the switch in a closed (low impedance) state. Alternatively the operation of the shut-off circuit can be tested at power-up. In such an arrangement the driver has an input for a signal that is used to derive a power supply within the driver circuit and a further input as a switch control signal.

Preferably the driver circuit further includes a second input for receiving data or a signal from a sensor that, in use, monitors the performance of the electronic switch or a load connected to the electronic switch. The sensor may, for example, detect under voltage or over voltage conditions, or other conditions that may cause or be indicative of a malfunction in the load. Preferably the sensor monitors the current flow to the load, and the driver circuit is arranged to switch the switch off so as to interrupt the current to the load in the event of excess current flow.

Advantageously, a fault simulating component or circuit simulates a fault condition at an input to the shut down circuit in response to the occurrence of the predetermined event at the first input.

Advantageously power for the driver circuit is derived from the switch control signal itself. When it is desired to switch the electronic switch on place it in a low impedance state) an oscillating signal, such as a sinusoid or a square wave, is generated by a controller and supplied to the first input of the driver circuit. This oscillating signal may pass through an isolation device, such as a transformer or a DC blocking capacitor and may then be rectified or used to drive a charge pump in order to charge a first capacitor to a sufficient voltage to turn the electronic switch on and also to provide power for the shut off circuit.

Preferably the shut off circuit comprises a comparator arranged to compare a signal from the current sensor with a predetermined reference value. Advantageously operation of the comparator is modified in response to occurrence of the predetermined event. Preferably a second capacitor, herein referred to as a self test capacitor, is connected between an input of the comparator and the first capacitor so as to simulate the signal conditions occurring at the input of the comparator that would correspond to an excess current flow during a first period following charging of the first capacitor. The self test capacitor functions as a fault simulator and ensures that the shut off circuit is tested each time the driver circuit is instructed to place the high side switch in a low impedance state. The self test capacitor may be provided solely to provide the self test function, or may serve a dual purpose within the driver circuit. In a preferred embodiment the current sensor is a resistor inserted in series with the high side switch and the load, and the self test capacitor discharges through the current sensing resistor such that the operational integrity of the current sensing resistor can also be checked.

Advantageously a controller is provided which has an input for monitoring a voltage occurring across the load and the controller is further responsive to the switch control signal for instructing the driver circuit to close the electronic switch or, preferably, the controller is the source of the switch control signal. The controller may then monitor the voltage occurring at the load in response to sending an instruction via the switch control signal to close the switch, and can determine that the switch off circuit is functioning correctly if the time delay between instructing the switch to close and the switch actually closing is greater than a first threshold period. The controller may also be adapted to check that the switch does indeed close before the expiry of a second threshold period and to signal a fault as having occurred if the switch does not close within the second time period.

Preferably the drive circuit is arranged to only temporarily interrupt the current flow to a load by opening the switch. A further controller, optionally having more "intelligence" can monitor the occurrence of the temporary interruptions and can make a decision as to whether to turn the supply to that load off by removing the "on" signal at the first input of the driver circuit.

According to a second aspect of the present invention there is provided a method of testing the operation of a shut off circuit within a driver circuit, wherein the driver circuit has an input for receiving an input signal, an output for controlling an output device, and a protection circuit for monitoring operation of the output device and placing it in a predetermined state in the event of a fault condition, and wherein the input is, in use, used to switch the controlled device between a first state and a second state, and wherein the occurrence of a predetermined event at the input causes a fault condition to be simulated such that the operation of the protection circuit can be tested.

BRIEF DESCRIPTION OF THE DRAWINGS

The present invention will further be described, by way of example, with reference to the accompanying drawings, in which.

DESCRIPTION OF PREFERRED
EMBODIMENTS OF THE INVENTION

Figure 1:
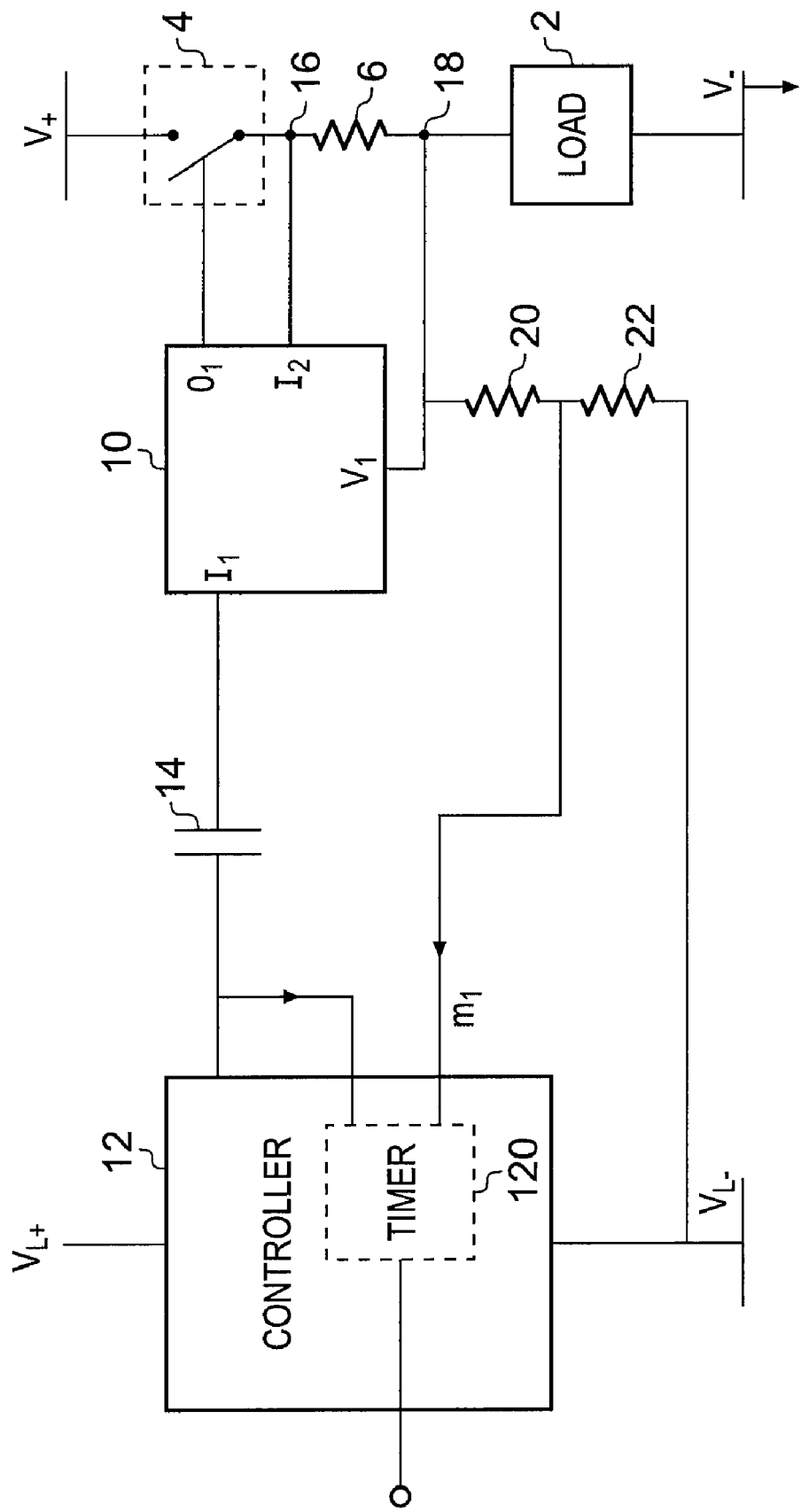
FIG. 1 schematically illustrates an electrical system having a load supplied from a first supply, a high side switch, a controller, and a driver circuit for the high side switch.

FIG. 1 schematically illustrates a power system associated with a load. The load 2 is connected between supply rails $V_+$ and $V_-$ of a first power supply. The load is connected directly to the $V_-$ rail which, frequently, will be held at a local "ground" voltage. An electrically controllable switch 4 and a current sensor 6, in this example a resistor, are connected in series between the $V_+$ rail and the load 2. The electrically controllable switch 4 will typically be an N-channel MOS-FET—although it should be appreciated that the present invention can be modified to work with P-channel MOSFETs. The switch is responsive to a driver circuit 10. A first output $O_1$ of the driver circuit is connected to a gate terminal of the switch 4. A first input terminal $I_1$ of the driver circuit 10 receives a control signal from a master controller 12. A DC blocking capacitor 14 is interposed between the controller 12 and the driver circuit 10 so as to provide isolation between these components, thereby enabling the controller 12 to operate at a second power supply voltage defined by second power supply lines $V_{L+}$ and $V_{L-}$.

The driver circuit 10 typically implements at least one safety function. The safety function may be under voltage or over voltage protection and/or over current protection. In the arrangement shown in FIG. 1 the driver circuit 10 is arranged to perform over current protection. In order to achieve this a second input $I_2$ of the driver circuit 10 is connected to a node 16 formed between the electronic switch 4 and the resistor 6 and a further connection $V_1$ is connected to a node 18 formed between the current sensing resistor 6 and the load 2. It can be seen that the voltage occurring at the input $V_1$ will vary between $V_-$ when the electronic switch is non-conducting and substantially $V_+$, less the voltage drops occurring across the switch 4 and the resistor 6, when the switch 4 is conducting. In order to achieve reliable circuit operation the driver circuit 10 is biased independently of the low voltage power supply $V_{L+}$ and $V_{L-}$ but similarly it is advantageous for the drive circuit 10 not to derive its power from the high voltage power supply $V_+$ and $V_-$. In order to achieve this, and as will be described later, the driver circuit 10 derives its power from the switch control signal occurring at its input $I_1$ and the driver circuit 10 floats with respect to the supply voltages $V_+$ and $V_-$.

In general, it is beneficial for the controller 12 to be able to determine that power has been supplied to the load 2. To achieve this a monitor input $M_1$ of the controller 12 is responsive to the voltage occurring at the node 18. However, rather than connect the input $M_1$ to the node 18 directly, the connection is made via a potential divider formed by resistors 20 and 22 which extend between the node 18 and the low voltage negative supply rail $V_{L-}$. Suitable selection of the size of resistors 20 and 22 can ensure that the voltage occurring at the monitor input $M_1$ is always constrained to lie between $V_{L-}$ and $V_{L+}$, being the operating voltage range of the controller 12.

Figure 2:
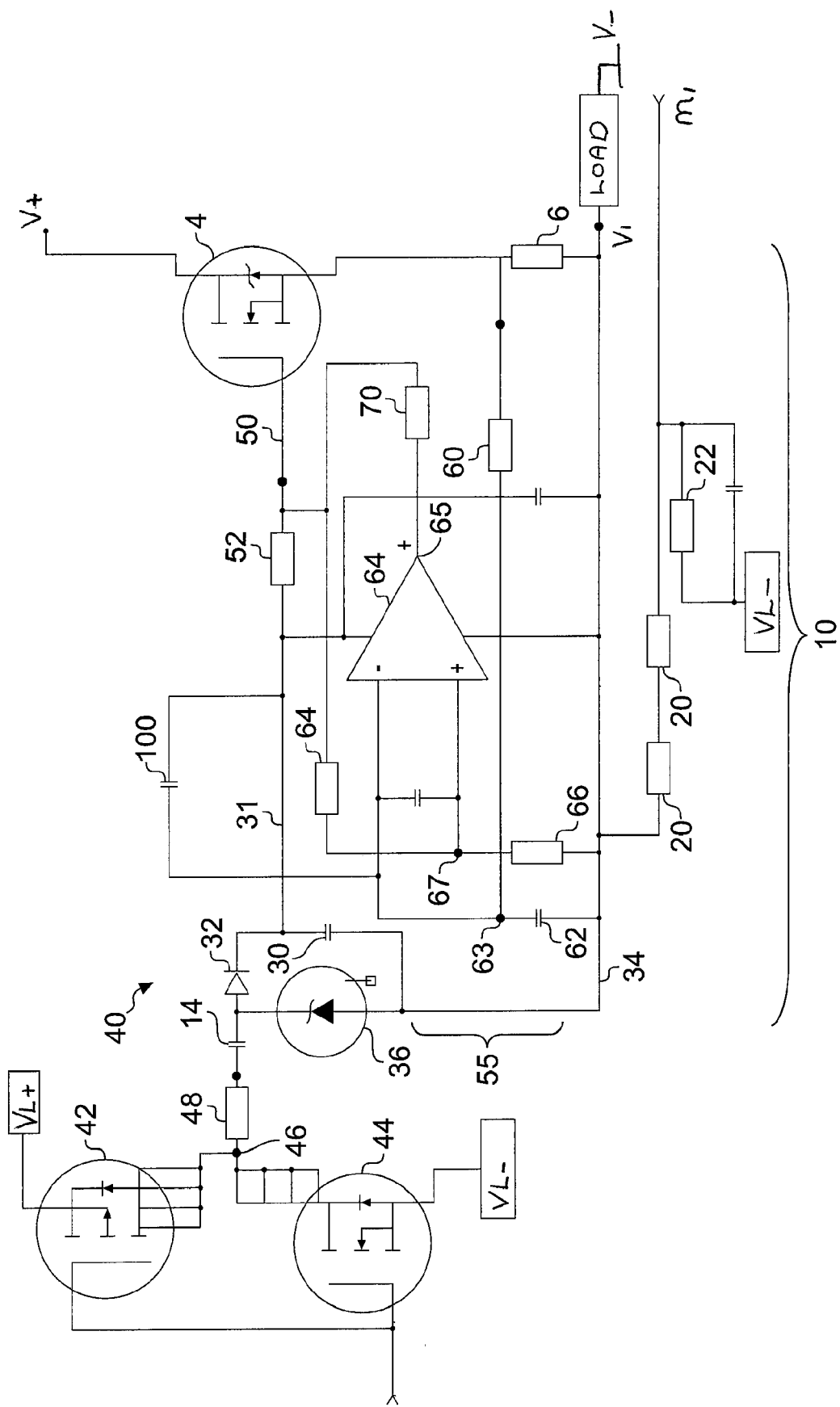
FIG. 2 shows the arrangement of the driver circuit in greater detail.

FIG. 2 shows the driver circuit 10 in greater detail and also shows some of the interface circuitry of the controller 12.

The driver circuit 10 comprises a charge pump formed from a first capacitor 30 having a first terminal thereof connected to a cathode of a diode 32 and to a supply rail 31, and a second plate of a capacitor 30 is connected to a supply rail 34 which, in use, is connected to the $V_1$ terminal. An anode of the diode 32 is connected to a first plate of the blocking capacitor 14 A further diode, such as a zener diode, 36 is connected between the supply rail 34 and the anode of the diode 32. The use of a zener diode enables operation of the charge pump (as would a normal diode) but also clamps the voltage on the first capacitor to stop it becoming too large. This charge pump arrangement, which for convenience will be generally designated 40 is driven with a substantially square wave signal from a pair of complimentary transistors 42 and 44 connected in a totem pole arrangement between first and second low voltage supply rails. In the context of an avionics environment, the positive supply rail may be a +12 volts or +28 volt DC supply rail and the negative supply rail may be the ground rail for the 28 volt DC supply. The transistors 42 and 44 have their gates connected to receive a common signal "KLC_OSC" generated by the controller 12 when it is desired to close the switch 4. In use, when the KLC_OSC signal is initiated a square wave voltage occurring at a node 46 between the transistors 42 and 44 is supplied to the charge pump 40, optionally via a current limiting resistor 48. The diode 32 acts to rectify the positive going half cycles of the square waves thereby charging capacitor 30 such that the voltage occurring at the first plate of the capacitor 30 is greater than the voltage at the terminal $V_1$. The voltage occurring at the first plate of capacitor 30 is supplied to a gate terminal 50 of the high side electronic switch 4 via a resistor 52. With resistor 48 having a resistance of 100 Ohms, blocking capacitor 14 having a capacitance of 0.1 microfarad and the storage capacitor 30 also having a capacitance of 0.1 microfarad the turn on time for the switch 4 is approximately 650 microseconds when the KLC_OSC signal is switching at 15 kHz and the transistors 42 and 44 act to generate a square wave having a peak to peak voltage of 12 volts.

The over current protection for the switch 4 is provided by a shut-off circuit 55, and a current sensing resistor 6 connected in series with the switch 4 and the load 2. In order to prevent inadvertent operation of the current limiting circuit due to transients, the voltage occurring across the resistor 6 is filtered by an RC network which is in parallel with the resistor 6 comprising resistor 60 in series with capacitor 62. The voltage occurring at a node 63 formed between the resistor 60 and the capacitor 62 is supplied to an inverting input of a comparator 64. Resistors 52, 64 and 66 are connected in series between the first plate of the capacitor 30 and the supply rail 34 and act to form a potential divider such that a reference voltage for the comparator 34 is available at a node 67 formed between the resistor 64 and 66. This reference voltage is supplied to the non-inverting input of the comparator 64. An output of the comparator is connected to the gate 50 of the switch 4 via a further resistor 70. The comparator 64 is arranged to receive its supply voltage from the capacitor 30 and hence the positive supply input of the comparator 64 is connected to the first plate of the capacitor 30 and the negative supply input of the comparator 64 is connected to the bus 34. The comparator may have an open collector output stage such that it's output is in a high impedance state when a fault (over current) condition does not exist.

In use, if an excess current condition occurs such that the voltage across the sensing resistor 6 exceeds a voltage threshold for a predetermined time, as set by the time constant of the resistor 60 and the capacitor 62, then the voltage occurring at the inverting input of the comparator 64 will exceed the voltage occurring at the non-inverting input and the comparator 64 will sink current through its output 65 and the resistor 70 thereby turning off the FET 4. Consequently the voltage across the current sensing resistor 6 will drop to zero and the RC network formed by resistor 60 and capacitor 62 will discharge towards a second threshold determined by resistor 52, resistor 64, resistor 70 and resistor 66, and after this delay the comparator will switch allowing the field effect transistor to be turned back on. The comparator circuit exhibits hysteresis, thereby avoiding rapid switching between on and off states. The switching on and off of the power supply to the load is monitored by the controller 12 using its M1 input as described hereinbefore. The controller 12 can then determine whether an over current condition has occurred.

It is desirable to be assured of the correct operation of the over current circuit and its ability to switch the field effect transistor off in the event of an over current condition occurring. In order to achieve this a further capacitor 100 which functions as a fault simulation or self test capacitor is connected between node 63 (and hence the inverting input of the comparator 64) and the positive supply rail 31 as provided by the capacitor 30. In use, when the positive supply rail 31 is energised by initiation of the charge pump the fault simulation (self test) capacitor 100 will pre-charge the capacitor 62 such that the voltage occurring at the inverting input of the comparator 64 exceeds the shutdown threshold voltage thereby keeping the field effect transistor turned off. In effect, the self test capacitor and the capacitor 62 initially act to form a capacitive potential divider. However the capacitor 62 can discharge via resistor 60 and the current measuring resistor 6 such that after a short period of time determined by the RC time constant of the capacitor 62 and its resistor 60 the capacitor 62 discharges sufficiently to switch the comparator 64 off thereby enabling the field effect transistor 4 to be turned on. However it will be apparent that the turning on of the field effect transistor 64 has been delayed with respect to the onset of the KLC_OLC signal compared to the switch on time if the self test capacitor 100 was not present.

In a preferred embodiment, the fault simulation capacitor has a value of approximately 200 picofarads, capacitor 62 has a value of 0.01 microfarads and resistor 60 has a value of 100 kilo Ohms. This has resulted in the self test circuit delaying the turn on time from the field effect transistor from 650 microseconds to approximately 1900 microseconds. This time delay is monitored by the controller 12 as shown in FIG. 1, thereby enabling the controller 12 to infer that the over current protection circuit is operating correctly. As schematically illustrated in FIG. 1 a timer 120 can be implemented, either in hardware or software, to compare the time between switching on the control signal, i.e. enabling KLC_OSC to start oscillating, and monitoring the transition at the input M1 indicative of the fact that the switch 4 has closed.

It is thus possible by the inclusion of a fault simulation/self test capacitor 100 to test the current limiting circuit to ensure that it does not have a dormant failure. The self test procedure is initiated automatically each time the charge pump is switched on and hence does not require any further control lines or signals to the driver circuit in addition to those which are routinely provided.

It will be appreciated that the self test capacitor 100 effectively appears in parallel with capacitor 62 when viewed from the current measuring resistor and consequently the inclusion of the self test capacitor lengthens the time that an excess current must flow for before the shut off feature is invoked. However, this can easily be accounted for by reducing the value of capacitor 62 or modifying the value of resistor 60.

Figure 3:
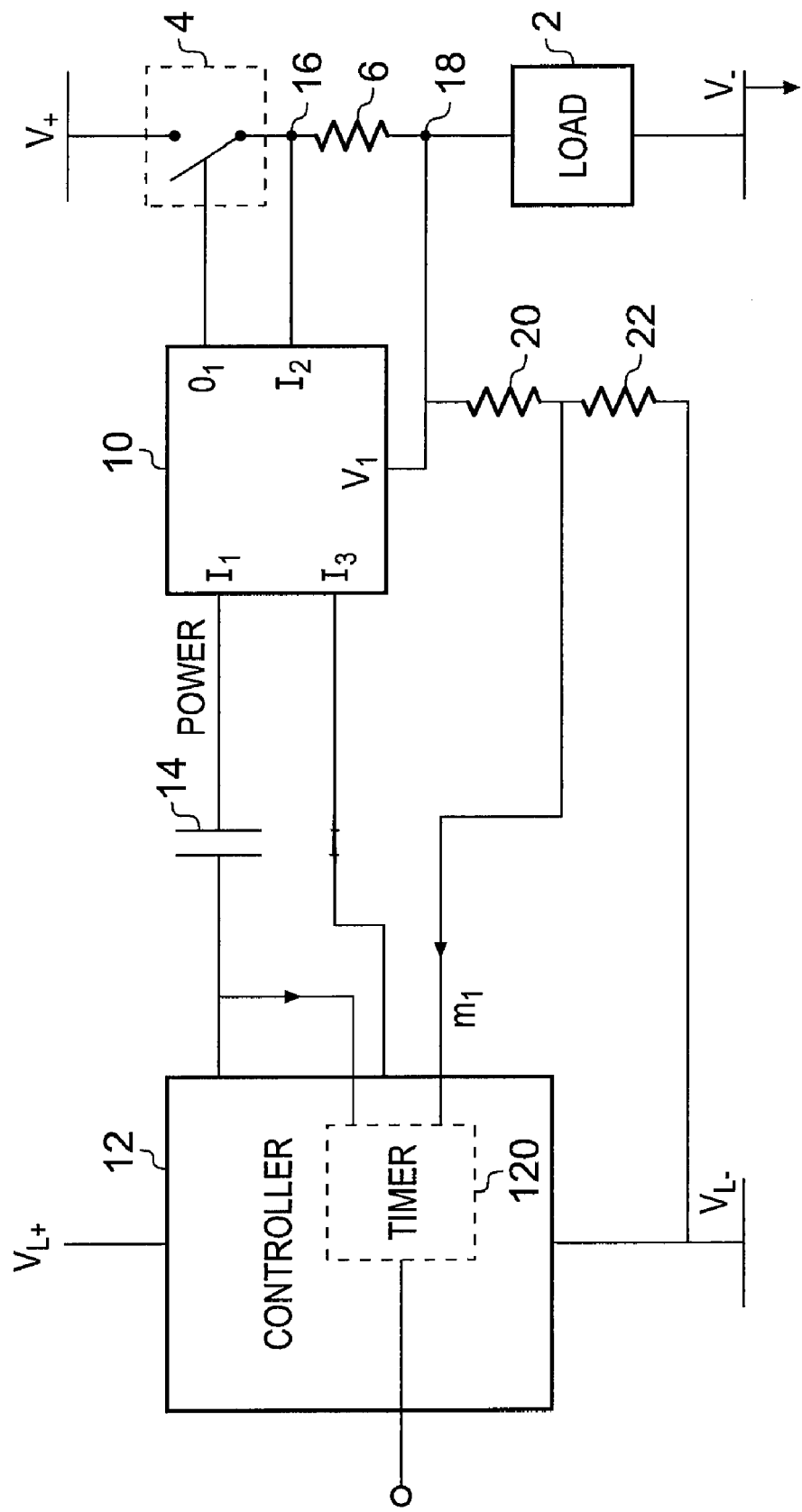
FIG. 3 shows a modification to the arrangement shown in FIG. 1.

In the arrangement described with respect to FIGS. 1 and 2 the power supply for the driver circuit 10 and the switch control signal were one and the same. However this need not necessarily be the case. FIG. 3 shows a modified version of FIG. 1 in which the signal provided at the input $I_1$ is used solely to provide a power supply for the protection circuit. A further input $I_3$ is provided for control of the switch for the load 2. The signal line between the controller 12 and the input $I_3$ could include a further DC blocking capacitor or could be a direct connection as shown.

Figure 4:
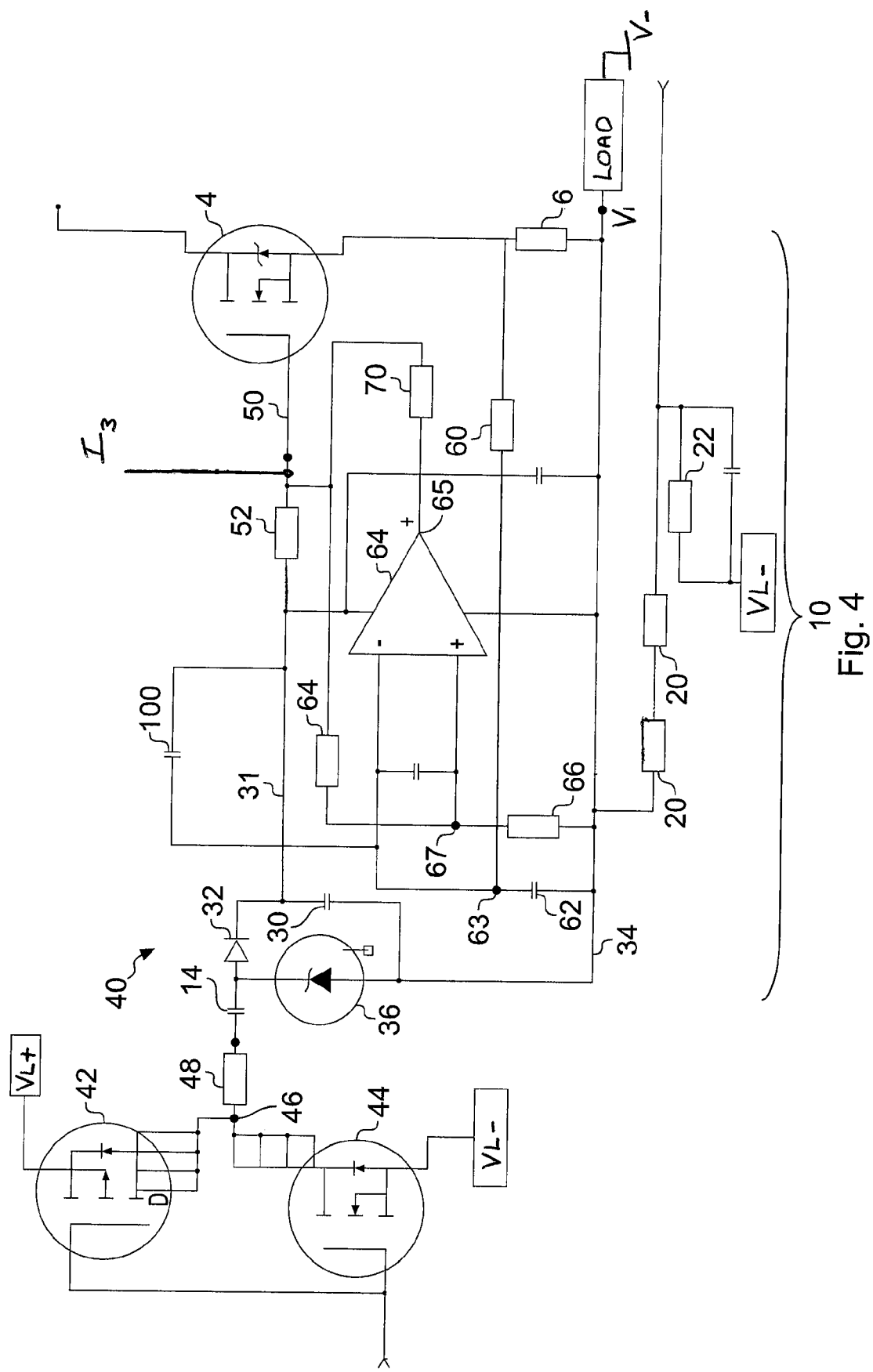
FIG. 4 shows a modified driver circuit.

FIG. 4 illustrates a modified version of the driver circuit adapted to work with separate power supply and control lines. The $I_3$ terminal is connected to the gate 50 of the transistor 4 such that the gate can be held at a voltage sufficient to hold the transistor in either an off state, or an on state, dependent upon the designer's choice.

In use, at initial power up $I_1$ is asserted and $I_3$ is held in a high impedance state or driven sufficiently weakly such that the comparator 64 sinks current through its output 65 to hold the transistor 4 off. As a consequence, switching the transistor 4 into the conducting condition will be delayed compared to the normal time between the application of the switch control signal at the input $I_3$ and the transistor 4 becoming conducting. This delay can be detected and used to infer correct operation of the over current protection circuit.

The oscillating signal to the input $I_1$ can then be left permanently enabled such that the power for the protection circuit is permanently available. The power supply can also, where appropriate, be used to supply other protection circuits. As a result, when it is desired to switch the switch 4 on then a switch control signal is supplied to the input $I_3$.

Although the circuit for generating the switch control signal has been described as using a direct connection to the controller the transmission of signals via an opto isolator is also possible as are other coupling methods. Once again, it should also be stressed that although this invention has been described in the context of controlling N channel MOSFETs, it can be modified to provide control for P channel MOSFETs.

Although the present invention has been described in the context of controlling a high side switch for a load, it can be used to provide protection circuit testing in other applications where turn on or operation of a device is monitored by a controller and where the inclusion of a small delay at turn on is acceptable.

The invention claimed is:

1. A switch control system comprising a driver circuit for an electronic switch, the driver circuit having a first input for receiving a first control signal,
   the driver circuit further including a shut-off circuit for operating the electronic switch to cause an interruption to the current flow in the event of a fault condition arising,
   wherein operation of the shut-off circuit can be temporarily invoked by initiation of the first control signal instructing the driver circuit to place the switch in a low impedance state;
   the control system further comprising a controller having a monitor input for monitoring a voltage occurring across a load, current flow through a load or a control signal supplied to the electronic switch so as to determine an operational state of the switch, and wherein the controller is arranged to monitor the time taken for the switch to close in response to initiation of the first control signal instructing the driver circuit to place the switch in a low impedance state, and the controller is arranged to indicate that the shut-off circuit is faulty if the switch switches on within a first predetermined time period.

2. A switch control system as claimed in claim 1, wherein the driver circuit has a first input for receiving the first control signal such that when the first control signal is in an "on" state the driver circuit places the electronic switch in a low impedance state, and,
   wherein placing the first control signal in the "on" state causes operation of the shut-off circuit such that the shut-off circuit temporarily delays the electronic switch attaining the low impedance state.

3. A switch control system as claimed in claim 2, wherein the driver circuit has a second input for receiving a signal from a sensor for detecting a fault condition.

4. A switch control system as claimed in claim 3, in which the sensor is a current sensor for measuring current flowing through the electronic switch and the fault condition is current flow in excess of a predetermined threshold.

5. A switch control system as claimed in claim 4, wherein the shut off circuit comprises a comparator for comparing a measurement of the current flow with a reference value, and where an occurrence of placing the first control signal in an "on" state is relayed to the comparator so as to change its operation.

6. A switch control system as claimed in claim 5, wherein a self test capacitor is provided as part of a timer circuit connected to an input of the comparator for simulating a value of the second input corresponding to current in excess of the predetermined threshold.

7. A switch control system as claimed in claim 6, wherein, in use, the current sensor is a resistor, and wherein the resistor forms part of the timer circuit such that the integrity of the resistor is checked in response to placing the first control signal in an "on" state.

8. A switch control system as claimed in claim 1, in which the driver circuit is a driver circuit for a high side electronic switch.

9. A switch control system as claimed in claim 2, in which placing the first control signal in an "on" state causes a fault simulator to simulate a fault at an input of the shut-off circuit.

10. A switch control system as claimed in claim 5, in which the input signal oscillates in the "on" state and is used to charge a first capacitor that provides power to the driver circuit.

11. A switch control system as claimed in claim 1, in which the driver circuit has a further input for receiving a switch control signal for controlling operation of the electronic switch, and wherein the first control signal is used to provide power for the shut-off circuit.

* * * * *

UNITED STATES PATENT AND TRADEMARK OFFICE
CERTIFICATE OF CORRECTION

| | |
|---|---|
| PATENT NO. | : 7,499,252 B2 |
| APPLICATION NO. | : 11/470345 |
| DATED | : March 3, 2009 |
| INVENTOR(S) | : Giovanni Mario Raimondi et al. |

Page 1 of 1

It is certified that error appears in the above-identified patent and that said Letters Patent is hereby corrected as shown below:

On the Title Page, add:

Item [30]  Foreign Application Priority Data
  Sept. 8, 2005   (UK)              0518333.0

Signed and Sealed this

Twenty-eighth Day of April, 2009

JOHN DOLL
*Acting Director of the United States Patent and Trademark Office*